(12) United States Patent
Tanase et al.

(10) Patent No.: US 8,507,899 B2
(45) Date of Patent: Aug. 13, 2013

(54) ELECTRIC TRANSPORT COMPONENT, METHOD OF MANUFACTURING THE SAME, AS WELL AS ELECTRO-OPTICAL DEVICE AND OPTO-ELECTRICAL DEVICE

(75) Inventors: Cristina Tanase, Waalre (NL); Erik Dekempeneer, Malle (BE); Herbert Lifka, Son en Breugel (NL); Ike de Vries, Kaatsheuvel (NL); Antonius Maria Bernardus van Mol, Eindhoven (NL)

(73) Assignees: Nederlandse Organisatie Voor Toegepast-Natuurwetenschappelijk Onderzoek TNO, Delft (NL); Koninklijke Philips Electronics N.V., Eindhoven (NL)

( * ) Notice: Subject to any disclaimer, the term of this patent is extended or adjusted under 35 U.S.C. 154(b) by 199 days.

(21) Appl. No.: 13/056,418

(22) PCT Filed: Aug. 5, 2009

(86) PCT No.: PCT/NL2009/050481
§ 371 (c)(1),
(2), (4) Date: Jul. 25, 2011

(87) PCT Pub. No.: WO2010/016763
PCT Pub. Date: Feb. 11, 2010

(65) Prior Publication Data
US 2011/0273824 A1   Nov. 10, 2011

(30) Foreign Application Priority Data
Aug. 5, 2008   (EP) .................................... 08161840

(51) Int. Cl.
*H01L 31/00*   (2006.01)
*H01L 51/00*   (2006.01)
*H01L 21/00*   (2006.01)
*H01L 29/08*   (2006.01)

(52) U.S. Cl.
USPC ......... 257/40; 257/E51.015; 438/19; 136/263

(58) Field of Classification Search
USPC ............... 257/40, E51.01, E51.011, E51.015, 257/E25.009; 136/236; 438/19
See application file for complete search history.

(56) References Cited

U.S. PATENT DOCUMENTS

| 6,878,297 B1 * | 4/2005 | Berger et al. .................. 216/17 |
| 6,949,400 B2 * | 9/2005 | Ryan ............................... 438/64 |

(Continued)

FOREIGN PATENT DOCUMENTS
EP   1 369 928 A1   12/2003

*Primary Examiner* — William D Coleman
(74) *Attorney, Agent, or Firm* — Novak Druce Connolly Bove + Quigg LLP

(57) ABSTRACT

An electric transport component may include a substrate provided with a barrier structure with a first inorganic layer, an organic decoupling layer and a second inorganic layer, wherein the organic decoupling layer is sandwiched between the first and the second inorganic layer, and at least one electrically conductive structure distributed in a plane defined by the organic decoupling layer, and that is accommodated in at least one trench in the organic decoupling layer. A method of manufacturing an electric transport component may include the steps of providing a first inorganic layer, providing a first organic decoupling layer, forming at least one trench in the organic decoupling layer, depositing an electrically conductive material in the at least one trench, and providing a second inorganic layer. The component may be applied for example in opto-electrical and electro-optical devices.

11 Claims, 7 Drawing Sheets

(56) References Cited

U.S. PATENT DOCUMENTS

| | | | |
|---|---|---|---|
| 7,635,600 B2* | 12/2009 | Zhang et al. | 438/7 |
| 8,071,414 B2* | 12/2011 | Yu et al. | 438/57 |
| 2003/0169618 A1* | 9/2003 | Lindsey et al. | 365/151 |
| 2006/0043403 A1 | 3/2006 | Hwang | |
| 2007/0085112 A1 | 4/2007 | Yamazaki et al. | |
| 2008/0230773 A1* | 9/2008 | Dickey et al. | 257/40 |
| 2008/0252210 A1* | 10/2008 | Banach et al. | 313/509 |
| 2009/0085475 A1* | 4/2009 | Park et al. | 313/504 |
| 2009/0266418 A1* | 10/2009 | Hu et al. | 136/260 |

\* cited by examiner

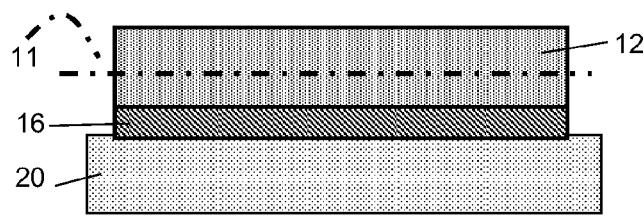
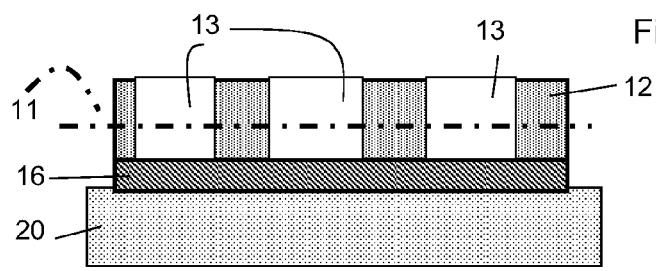
Figure 3A
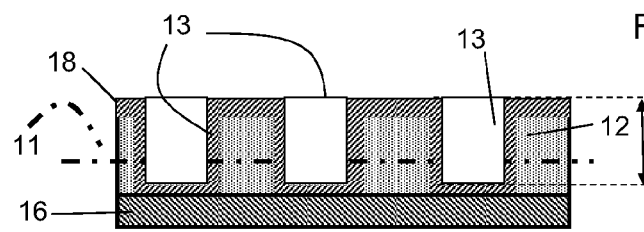
Figure 3B
Figure 3C

ELECTRIC TRANSPORT COMPONENT, METHOD OF MANUFACTURING THE SAME, AS WELL AS ELECTRO-OPTICAL DEVICE AND OPTO-ELECTRICAL DEVICE

CROSS-REFERENCE TO RELATED APPLICATIONS

This application is filed under 35 U.S.C. 371 as a U.S. national phase application of PCT/NL2009/050481, having an international filing date of 5 Aug. 2009, which claims the benefit of European Patent Application No. 08161840.7, having a filing date of 5 Aug. 2008, both of which are hereby incorporated by reference.

BACKGROUND OF THE INVENTION

1. Field of the Invention

The present invention relates to an electric transport component. The present invention further relates to an electronic device comprising the product. The present invention further relates to a method of manufacturing the product.

2. Related Art

For large area OLED lighting on flexible plastic substrates, a large current is required to drive the system. The present thin film materials used for the anode (e.g. ITO) and cathode (e.g. Ba/Al) have a large resistivity and the large currents give rise to substantial voltage drop, which determine inhomogeneous light emission. For producing large area flexible OLED devices on plastic substrates there is a need for additional metallization structure of the plastic substrate. For reducing the manufacturing costs, such structured metallization coatings will preferably be applied on rolls of plastic foil using an inline roll-to-roll web coating process. Accordingly, for electro-optic devices, such as light emitting devices and electro-chromic devices, but also for opto-electric devices, such as photo-voltaic products there is a need for a metallization structure that on the one hand has a good electrical conductivity, while on the other hand has a high transmission for radiation. According to state-of-the-art roll-to-roll web coating techniques, a system for full metallization or patterned metallization areas of a continuous substrate has been reported (EP 1 693 481 A1). However, these techniques provide metallic features that are on top of the substrate and are relatively large.

SUMMARY OF THE INVENTION

The improved electric transport component comprises a substrate provided with a barrier structure with a first inorganic layer, an organic decoupling layer and a second inorganic. At least one electrically conductive structure is accommodated in trenches in the organic decoupling layer. In the improved product the walls of the trenches support the electrically conductive structure. Therewith a larger degree of freedom is available for the choice of the aspect ratio of the electrically conductive structure. The aspect ratio is defined here as the height of the electrically conductive structure, transverse to the plane of the organic decoupling layer, divided by the smallest dimension of said structure within the plane of the organic decoupling layer. The electrically conductive structure is accommodated in the organic decoupling layer of the barrier structure. Therewith the organic decoupling layer serves a dual purpose and in manufacturing of the component only a single step is necessary to provide the organic decoupling layer that decouples the inorganic layers and that accommodates the electrically conductive structure.

In particular in organic opto-electronic or electro-optical structures often materials are applied that are sensitive to moisture. The electric transport component according to this embodiment when applied in a device comprising an organic opto-electronic or electro-optical structure therewith provides for an electric signal or power transport function, but also for a protection of the device against moisture. One of the inorganic layers separates the electrically conductive structure from the organic decoupling layer. In this embodiment the electrically conductive structures has a free surface. This allows for an efficient way of providing an electrical contact between the improved electric transport component according to the invention and an electro-optical or opto-electronic functional component when integrating these components into an electro-optical or opto-electronic device.

An electro-optical device may be formed by a combination of the improved electric transport component with an electro-optical functional component attached thereto that converts for example the electric power provided by the electric transport component into (visible) radiation, or that has an optical property (e.g. transmissivity in an electrochromic cell) that is controlled by an electric signal transported via the electric transport component. Alternatively the improved electric transport may be combined with an opto-electrical functional component that converts (visible) radiation into electric energy, where the improved electric transport component serves to transport electric power generated in the opto-electrical component to external terminals.

More in particular, an electro-optic device, comprising the electric transport component includes an electro-optic functional structure applied at a main surface of the electric transport component, the electro-optic functional structure comprising a first and a second electrically conductive layer, and at least one electro-optically functional layer sandwiched between the electrically conductive layers, at least one of the electrically conductive layers being electrically coupled to the at least one electrically conductive structure.

Likewise, an opto-electric device, comprising the electric transport component includes an opto-electric functional structure applied at a main surface of the electric transport component, the opto-electric functional structure comprising a first and a second electrically conductive layer, and at least one opto-electrically functional layer sandwiched between the electrically conductive layers, at least one of the electrically conductive layers being electrically coupled to the at least one electrically conductive structure.

The improved electric transport component may have a plurality of such electrical conductive structures, so that the electric transport component may provide for example both polarities of a power supply to a single side of the electro-optical functional component, or receive both polarities from the opto-electrical component. In that case the electric transport component may be opaque. Alternatively, at both sides of the electro-optical functional component (or the opto-electric functional component) an electric transport component having only a single electrically conductive structure may be applied each serving as a respective electric conductor for each one of the polarities. In that case it is desirable that at least one of the electric transport components has a sufficiently high transmissivity.

Where it is desired that the electric transport component is also transmissive, the at least one electrically conductive structure occupies a fraction of the area of the plane of the organic decoupling layer in a range of 0.1 to 20%, said occupied fraction being regularly distributed over the area of the plane. For a substantially larger occupied fraction, e.g. a fraction of 30% the amount of absorbed radiation is relatively high, which would be at the cost of the efficiency of the device, e.g. a photo-voltaic cell or a light-emitting diode, wherein the electric transport component is applied. For a substantially smaller fraction, e.g. a fraction of less than 0.05%, the resistance of the at least one electrically conductive structure would be relatively high, which would also result in a lower efficiency and in the case of a light-emitting device, into an inhomogeneous light-output.

In an embodiment the at least one electrically conductive structure comprises line shaped segments. Line shaped segments are considered to be curved or straight segments that have a length that is substantially greater, e.g. at least 10 times greater, than their width. In this way a high transmissivity can easily be obtained.

In a particular embodiment of the component the electrically conductive structure comprises elongated elements having a first D1 and a second dimension D2 extending in a direction in the plane formed by the organic decoupling layer and a third dimension D3 extending transverse to the plane, wherein the third dimension has a value in a range between the first and the second dimension. In this embodiment a high transmissivity for (visible) radiation and a high electrical conductivity are combined.

In a practical embodiment, the electrically conductive structure comprises a layer of a reflective electrically conducting material, such as Ag, Cu or Al.

In an embodiment the at least one trench extends over the full depth of the organic decoupling layer. This makes it possible to separate the electric transfer component, or an electric device comprising the electric transfer component into parts at cutting lines through the electrically conductive structure, and hence without cutting through the organic decoupling layer.

The electric transport component may be flexible so that it can be used for products that are to be stored compactly, for example in rollable displays.

The electric transport component according to the present invention allows for an attractive method of manufacturing according to the present invention.

A method of manufacturing an electric transport component according to the invention comprises the steps of
   a) providing a first inorganic layer
   b) providing a first organic decoupling layer on the first inorganic layer,
   c) forming at least one trench in the organic decoupling layer,
   d) depositing an electrically conductive material in the at least one trench,
   e) providing a second inorganic layer.

The electrically conductive material may be deposited in the at least one trench either before or after applying the second inorganic layer.

In an attractive embodiment of said method, the pattern of at least one trench in the organic decoupling layer is formed by soft lithography. By this method, wherein a stamp, for example a PDMS rubber stamp, is embossed into a partially reacted organic layer trenches can be formed that can have an aspect ratio of up to 10. Alternatively other methods such as photolithography to produce the patterned organic decoupling layer directly or with anisotropic etching may be used.

The present invention is in particular relevant for manufacturing large area products (e.g. large area OLEDS, electrochromic windows and solar panels) in a roll-to-roll process. The electrical transport component may be manufactured as a semi-finished product being a roll of film (up to a few km in length and over 1 m in width).

The electric transport component may be manufactured at a substrate of a flexible material, e.g. a polymer foil, e.g. from polyester, a polyethylene, such as polyethylene terephthalate (PET) or polyethylene naphthalate (PEN) or a polyimide such as KAPTON® etc. or a rigid material such as steel or glass. If desired, the electric transport component may be removed from the substrate at a later stage, for example after completion of the manufacturing process, or after integration with the electric transport component with one or more other components in an end-product.

BRIEF DESCRIPTION OF THE DRAWINGS

These and other aspects are described in more detail with reference to the drawing. Therein.

DETAILED DESCRIPTION OF EMBODIMENTS

Figure 1:
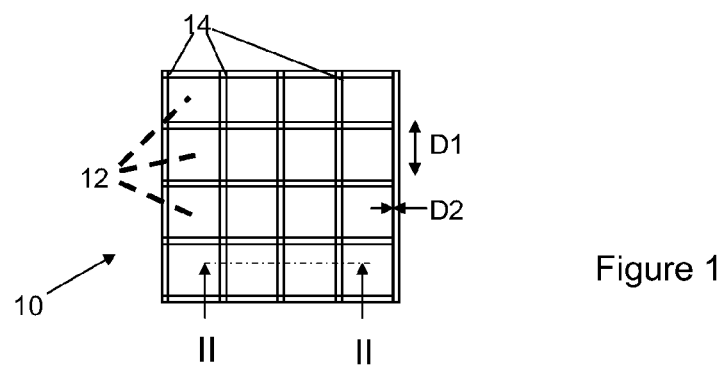
FIG. 1 shows a first embodiment of an electric transport component according to the invention.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Figure 2:
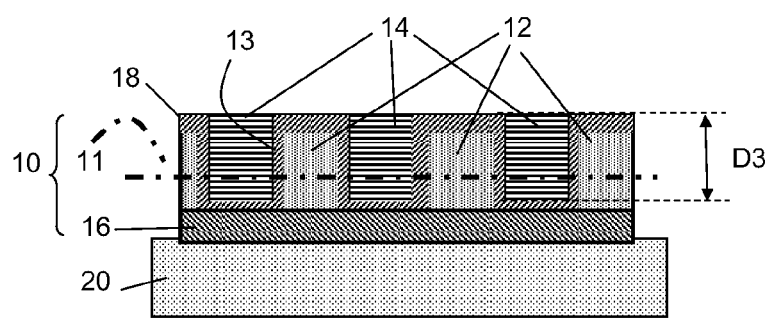
FIG. 2 shows a cross-section of said embodiment according to line II-II in FIG. 1, FIGS. 3A-3C show a method of manufacturing said first embodiment.

FIG. 1 and FIG. 2 show a first embodiment of an electric transport component according to the invention. FIG. 2 shows a partial cross-section according to II-II in FIG. 1. For clarity the dimensions in FIGS. 1 and 2 are not shown to scale. The electric transport component 10 comprises an organic decoupling layer 12 and at least one electrically conductive structure 14 distributed in a plane 11 defined by the organic decoupling layer, and that is accommodated in at least one trench 13 in the organic decoupling layer 12. Herein, the at least one trench 13 extends over the full depth of the organic decoupling layer. In this way the electric transport component 10 may be cut at cutting lines extending along the electrically conductive structure into smaller components without damaging the organic decoupling layer.

In the embodiment shown the electric transport component 10 is applied at a substrate 20 and a barrier structure is provided that comprises a first inorganic layer 16, an organic decoupling layer 12 and a second inorganic layer 18. The organic decoupling layer 12 is sandwiched between the first 16 and the second inorganic layer 18.

The inorganic layer may have a thickness of 10-2000 nm and can be any transparent inorganic coating with a known good barrier performance ($AlO_x$, $SiN_x$, $SiO_xN_y$). Also thin metals might be embedded in the inorganic layer(s). The organic decoupling layer may have a thickness of 0.1-100 µm and can be a cross-linked (thermoset) material, an elastomer, a linear polymer, or a branched or hyper-branched polymer system or any combination of the aforementioned, optionally filled with inorganic particles of small enough size to still guarantee light transmission. The material is processed either from solution or as a 100% solids material. The material of the organic decoupling layer preferably has a low specific water vapour transmission rate and a high hydrophobicity.

Other suitable materials for the barrier structure in these and other embodiments of the present invention are described in earlier filed European patent application EP08156493.2. In the embodiment shown in FIGS. 1 and 2, the organic decoupling layer 12 also forms the organic decoupling layer that accommodates the electrically conductive structure 14. Note that in FIG. 1 the organic decoupling layer 12 is indicated by dashed lines, as it is covered by the second inorganic layer 18. One of the inorganic layers, in this case the second inorganic layer 18, separates the electrically conductive structure 14 from the organic decoupling layer 12. In this embodiment the electrically conductive structure 14 has a free surface that can be used as a contact for integration with other components.

In the embodiment shown in FIGS. 1 and 2 the at least one electrically conductive structure 14 occupies a fraction of the area of the plane 11 in a range of 0.1 to 20%, in this case about 5%. The occupied fraction is regularly distributed over the area of the plane 11. The at least one electrically conductive structure 14 comprises line shaped segments having a length D1 and a width D2. The ratio D1/D2 is about 15, the width D1 being in a range of 1-100 µm. The thickness D3 in the direction transverse to the plane 11 for example is in the range of 0.1-100 µm.

In particular in the electrical transport component according to the embodiment of FIGS. 1 and 2 the electrically conductive structure 14 comprises elongated elements having a first D1 and a second dimension D2 extending in a direction in the plane 11 formed by the organic decoupling layer 12 and a third dimension D3 extending transverse to the plane 11, wherein the third dimension D3 has a value in a range between the first and the second dimension D1, D2.

FIG. 3A illustrates a method of manufacturing an electric transport component according to the present invention, for example the component as shown in FIGS. 1 and 2. FIG. 3A shows a first step according to said method, wherein an organic decoupling layer 12 is provided. In this case organic decoupling layer 12 is provided at a substrate 20 that has a layer 16 of an inorganic material. Intermediate layers may be present between the substrate 20 and the layer of an inorganic material 16, for example a planarization layer. Likewise, intermediate layers may be present between the layer of an inorganic material 16, and the organic decoupling layer 12.

FIG. 3B shows a further step, wherein at least one trench 13 is applied in the organic decoupling layer 12. For example a single trench 13 may be applied that meanders in the surface of the organic decoupling layer 12, a plurality of mutually connected trenches may be applied, or separate trenches may be applied.

As shown in FIG. 3C, the organic decoupling layer 12 may optionally be covered with an inorganic layer 18. In order to form the at least one trench in the organic decoupling layer for example soft lithography (embossing PDMS rubber stamp into a partially reacted organic layer) may be applied. In this way trenches are formed that can have an aspect ratio of up to 10.

Further the organic decoupling layer is fully cured after imprinting e.g. by polymerization using a heat-treatment or UV-radiation.

The trenches are treated such that no organics remain in bottom of the trench on top of the first inorganic barrier layer. A plasma etch might be used for this cleaning. Remaining organic material could form a diffusion path for moisture.

In a further step an electrically conductive material that is to form the at least one electrically conductive structure 14 is deposited in the at least one trench 13. Therewith the component shown in FIGS. 1 and 2 is obtained.

To mitigate that the conductive material spreads out at the surface, the top surface is made hydrophobic and the trenches are made hydrophilic. The trenches may be filled in a single step, for example by sputtering, or by vapour deposition, such as MOCVD, and combining this with the step of polishing or etching. Preferably the trenches are filled with a two-stage process. For example the trenches can be filled with an evaporated metal (e.g. Al like in patent EP 1 693 481 A1) or with solution based metals (e.g. Ag, Au, Cu) and an extra baking step (below 150 C). The next process is to fill completely the trenches in order to compensate for shrinkage of the material in the trenches. The electrically conductive material applied during the second step may be the same, but may alternatively be a different material. The metals Ag, Au, and Cu for example have a high reflectivity and therewith preferred as the second electrically conductive material. During this process attention should be paid to the structure design such that the contact area for an electrically conductive layer of a functional component that is to be assembled with the electrical transport component does not come in direct contact with another conductive layer of the functional component, in order to prevent shortcuts. In an alternative method the electrically conductive material is applied in a single step.

An inline vacuum or air based roll-to-roll web coating system known as such may be used to apply the organic and inorganic layers. The coating system consists of multiple sections combining an unwind, a rewind and in between a multiple of process chambers dedicated for example to pretreat a substrate surface, or coat a substrate surface with an inorganic layer, or coat a substrate surface with an organic layer, or coat a substrate surface with a patterned organic layer, or cure an organic coated surface.

The inorganic layers may be applied by all kinds of physical vapour deposition methods such as thermal evaporation, e-beam evaporation, sputtering, magnetron sputtering, reactive sputtering, reactive evaporation, etc. and all kinds of chemical vapour deposition methods such as thermal chemical vapour deposition (CVD), photo assisted chemical vapour deposition (PACVD), plasma enhanced chemical vapour deposition (PECVD), etc.

The organic layers may be applied by all kinds of coatings techniques, such spin coating, slot-die coating, kiss-coating, hot-melt coating, spray coating, etc. and all kinds of printing techniques, such as inkjet printing, gravure printing, flexographic printing, screen printing, rotary screen printing, etc.

Figure 4:
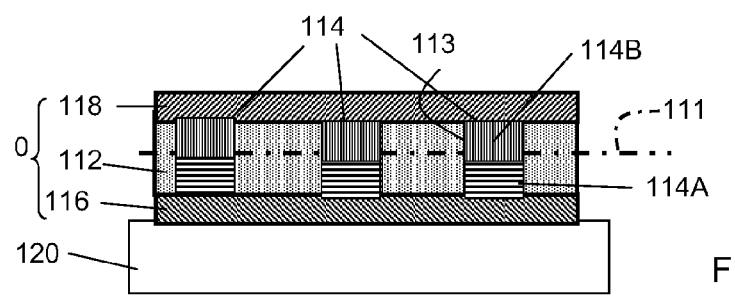
FIG. 4 shows a second embodiment of an electric transport component according to the invention.

FIG. 4 shows another embodiment of a component according to the invention. Parts therein corresponding to those in FIGS. 1 and 2 have a reference number that is 100 higher. In the embodiment of FIG. 4, the electrically conductive structure 114 is arranged between the inorganic layers 116, 118. In the embodiment shown in FIG. 4 the at least one electrically conductive structure 114 is a dual layer 114A, 114B of electrically conductive materials. The layers 114A, 114B may have the same composition, but may alternatively have a different composition. For example, the first layer 114A is a layer of a relatively cheap electrically conductive material, e.g. Al, while the second layer 114B is a highly reflective electrically conductive material such as Ag. Due to its high reflection it prevents that emitted radiation is lost in the electrically conductive structure 114. This is favourable for the radiation output of electro-optic devices. In opto-electric devices a higher efficiency can be achieved in the conversion of radiation energy into electric energy. Although the latter material used for the layer 114B is relatively expensive, the layer 114B can be relatively thin due to the presence of the layer 114A.

The embodiment of FIG. 4 may be manufactured analogously to the embodiment shown in FIGS. 1, 2, apart from the fact that the second inorganic layer 18 is applied after the trenches 113 have been filled with the electrically conductive material that is to form the electrically conductive structure 114. In this case it is not necessary to clean the trenches, as the second inorganic layer 118 is applied on top of the embedded electrically conductive structure 114.

Figure 5:
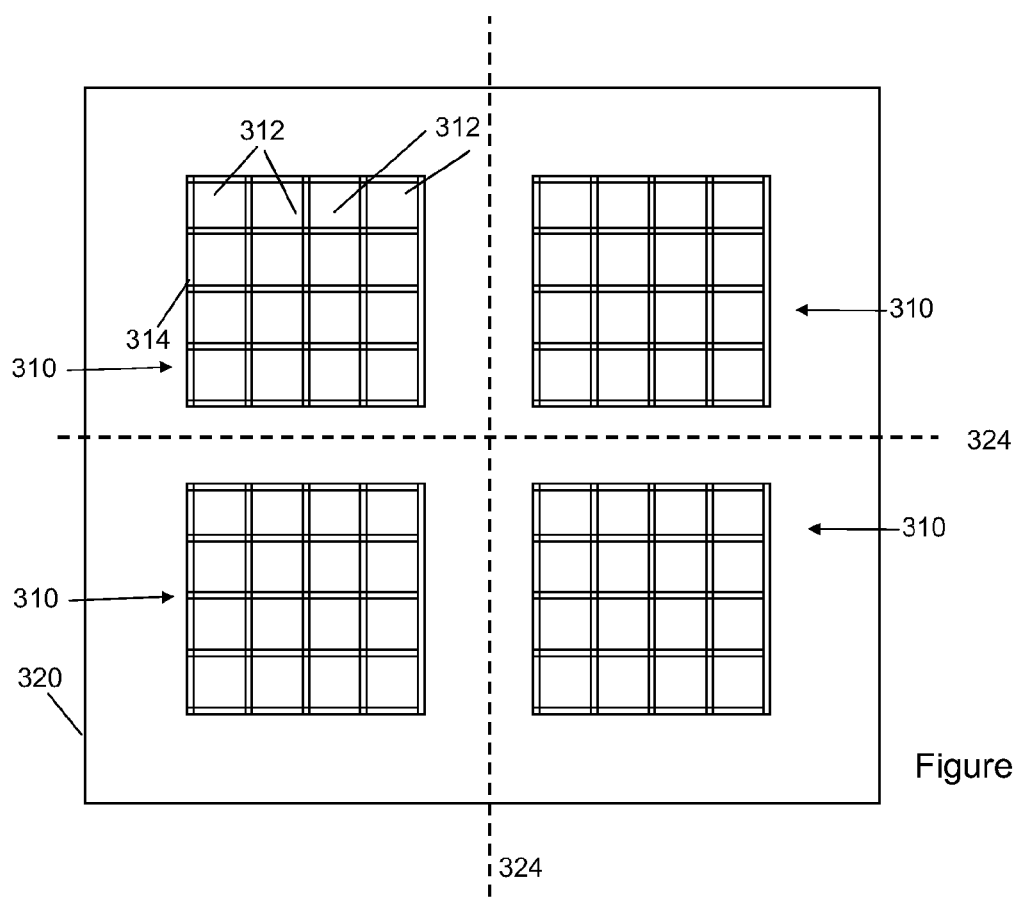
FIG. 5 shows a third embodiment of an electric transport component according to the invention.

As shown in FIG. 5, wherein parts corresponding to those in FIG. 1 have reference numbers that are 300 higher a plurality of mutually separate electrically conductive structures 310 may be applied at a common substrate. Each of the electrically conductive structures 310 may be arranged at a respective barrier structure wherein the organic decoupling layer is fully encapsulated by the inorganic layers, as is for example shown in FIG. 2. When cutting the semi-finished product shown in FIG. 5 according to cutting lines 324, the encapsulation is maintained intact therewith providing a full protection against moisture.

Figure 6A:
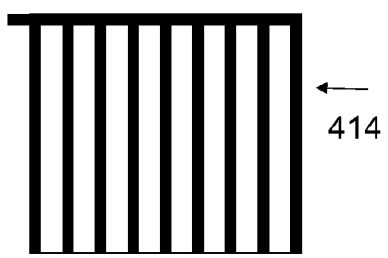
FIGS. 6A-6D show electrically conductive structures in various embodiments according to the invention.
Figure 6B:
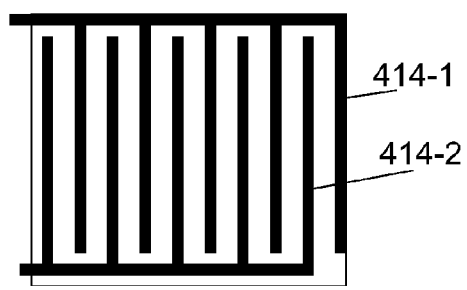
Figure 6C:
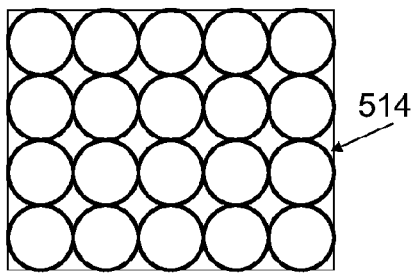
Figure 6D:
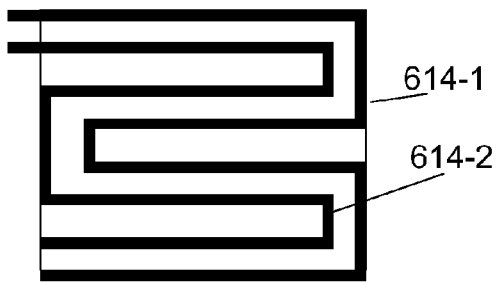

The at least one electrically conductive structure need not be maze-shaped as shown in FIGS. 1 and 5. Other topologies may be applied, for example as shown in FIGS. 6A-6D. For clarity in these FIGs. only the electrically conductive structure is shown. The electrically conductive structures shown may be used in any embodiment, for example the embodiment shown in FIG. 2 or 4, or in other embodiments. In FIG. 6A, the at least one electrically conductive structure 414 is a comb structure. In FIG. 6B a pair of electrically conductive structures 414-1, 414-2, each in the form of a comb structure, and gripping into each other is shown. FIG. 6C shows another example of a maze-like electrically conductive structure 514. Also other structures are possible e.g. in the form of a honeycomb. FIG. 6D shows an example wherein a plurality of meandering electrically conductive structures 614-1, 614-2 is arranged. In the example a pair of conductors is shown that may for example each carry a polarity of power sources. However, additional electrically conductive structures may be present, for example to carry control signals.

Figure 7:
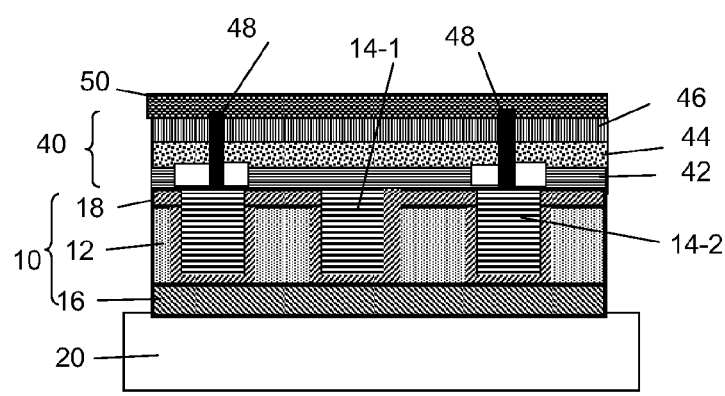
FIG. 7 shows a first embodiment of an electro-optic or opto-electric device according to the invention.

FIG. 7 shows an example of an electro-optical or an opto-electrical product comprising a combination of an electric transport component 10 according to the present invention and an electro-optic or an opto-electric functional structure 30 applied at a main surface of the electric transport component. In the embodiment shown in FIG. 7 the electric transport component comprises a first and a second electrically conductive structure 14-1, 14-2 that are arranged in relation to the organic decoupling layer 12 and the inorganic layers 16, 18 analogously as shown in FIG. 2. The electrically conductive structures may for example have a topology as shown in FIG. 6B or in FIG. 6D for example. The electro-optic or opto-electric functional structure 40 comprises a first and a second electrically conductive layer 42, 46, and at least one electro-optically functional layer 44 sandwiched between the electrically conductive layers 42, 46. Both the electrically conductive layers 42, 46 are electrically coupled to a respective electrically conductive structure 14-1, 14-2. The first electrically conductive layer is directly coupled to the first electrically conductive structure 14-1 and insulated from the second electrically conductive structure 14-2. The second electrically conductive layer 46 is coupled to the second electrically conductive structure via transverse conductors 48 that are insulated from the first electrically conductive layer 42. An additional barrier structure 50 is applied at the electro-optic or opto-electric structure.

Figure 8:
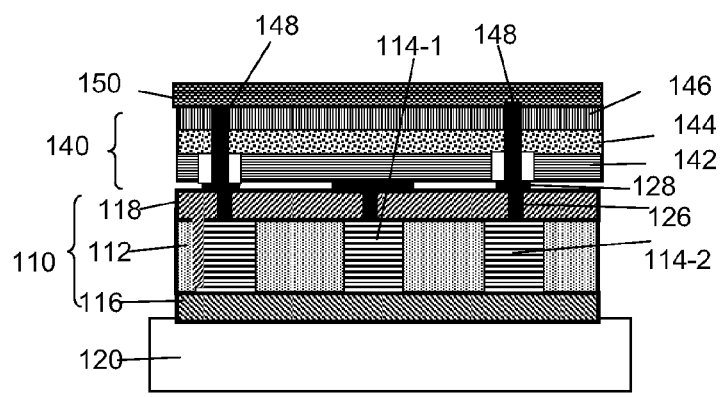
FIG. 8 shows a second embodiment of an electro-optic or opto-electric device according to the invention.

In FIG. 8, parts corresponding to those in FIG. 7 have a reference number that is 100 higher. FIG. 8 shows another example of an electro-optical or an opto-electrical product comprising a combination of an electric transport component 110 according to the present invention and an electro-optic or an opto-electric functional structure 140 applied at a main surface of the electric transport component. In the embodiment shown in FIG. 8 the electric transport component 110 comprises a first and a second electrically conductive structure 114-1, 114-2 that are arranged in relation to the organic decoupling layer 112 and the inorganic layers 116, 118 analogously as shown in FIG. 4. As in FIG. 7, the electrically conductive structures 114-1, 114-2 may for example have a topology as shown in FIG. 6B or in FIG. 6D for example. In this case an additional metal layer is applied at the second inorganic layer 118 that forms electrical contacts 128 connected to the electrically conductive structures 114-1, 114-2. To that end vias 126 are applied in the second inorganic layer 118 that are filled with an electrically conductive material.

Figure 9:
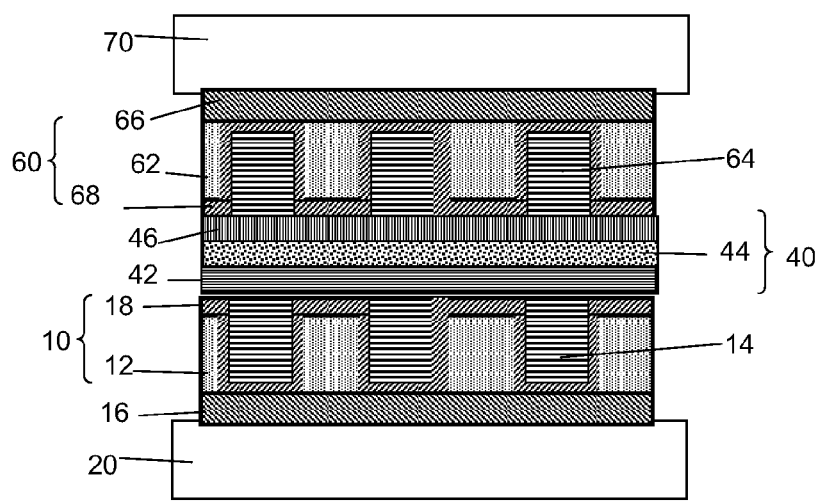
FIG. 9 shows a third embodiment of an electro-optic or opto-electric device according to the invention.

FIG. 9 shows a further example of an electro-optical or an opto-electrical product. In FIG. 9 an electro-optic or an opto-electric functional structure 40 is sandwiched between a pair of electric transport components 10, 60 applied at substrates 20, 70 respectively. Both electric transport components 10, 60 correspond to the electric transport component of FIGS. 1, 2. Parts of the electric transport component 60 corresponding to those of FIG. 9 have a reference number that is 50 higher. Parts of the functional structure (electro-optic or opto-electric) corresponding to the functional structure in FIG. 7 have the same reference numeral. In this embodiment each of the electrically conductive layers 42, 46 is coupled to a respective electro conductive structure 14, 64 of a respective etc 10, 60.

In case of application in a light-emitting device, the organic decoupling layer comprising the electric conductive structure may further be provided with scattering particles having a relatively high refractive index in comparison to the relatively low reflective index of the organic decoupling layer to improve light output. Alternatively an additional layer with such particles may be present, for example such a layer may be applied at the free surface of the substrate of the electric transport component.

In the claims the word "comprising" does not exclude other elements or steps, and the indefinite article "a" or "an" does not exclude a plurality. A single component or other unit may fulfil the functions of several items recited in the claims. The mere fact that certain measures are recited in mutually different claims does not indicate that a combination of these measures cannot be used to advantage. Any reference signs in the claims should not be construed as limiting the scope.

What is claimed is:

1. Electric transport component comprising a substrate provided with a barrier structure with a first inorganic layer, an organic decoupling layer and a second inorganic layer, wherein the organic decoupling layer is sandwiched between the first and the second inorganic layer, and at least one electrically conductive structure distributed in a plane defined by the organic decoupling layer, and that is accommodated in at least one trench in the organic decoupling layer, wherein one of the inorganic layers separates the electrically conductive structure from the organic decoupling layer.

2. A component according to claim 1, wherein the at least one trench extends over the full depth of the organic decoupling layer.

3. A component according to claim 1, wherein the at least one electrically conductive structure occupies a fraction of the area of the plane in a range of 0.1 to 10%, said occupied fraction being regularly distributed over the area of the plane.

4. A component according to claim 1, wherein the at least one electrically conductive structure comprises line shaped segments.

5. A component according to claim 1, wherein the electrically conductive structure comprises a layer of a reflective material.

6. A component according to claim 1, wherein the electrically conductive structure comprises elongated elements having a first dimension D1 and a second dimension D2 extending in a direction in the plane formed by the organic decoupling layer and a third dimension D3 extending transverse to the plane, wherein the third dimension has a value in a range between the first and the second dimension.

7. An electro-optic device, comprising a component according to claim 1, and an electro-optic functional structure applied at a main surface of the electric transport component, the electro-optic functional structure comprising a first and a second electrically conductive layer, and at least one electro-optically functional layer sandwiched between the electrically conductive layers, at least one of the electrically conductive layers being electrically coupled to the at least one electrically conductive structure.

8. An opto-electric device, comprising a component according to claim 1, and an opto-electric functional structure applied at a main surface of the electric transport component, the opto-electric functional structure comprising a first and a second electrically conductive layer, and at least one opto-electrically functional layer sandwiched between the electrically conductive layers, at least one of the electrically conductive layers being electrically coupled to the at least one electrically conductive structure.

9. Method of manufacturing an electric transport component comprising the steps of
   a) providing a first inorganic layer
   b) providing a first organic decoupling layer on the first inorganic layer,
   c) forming at least one trench in the organic decoupling layer,
   d) depositing an electrically conductive material in the at least one trench,
   e) providing a second inorganic layer, wherein the electrically conductive material is applied after step e).

10. Method according to claim 9, wherein the component is separated into parts along cutting lines that extend through the electrically conductive material.

11. Method according to claim 9, wherein the pattern is formed by soft-lithography.

* * * * *

UNITED STATES PATENT AND TRADEMARK OFFICE
CERTIFICATE OF CORRECTION

PATENT NO.        : 8,507,899 B2
APPLICATION NO. : 13/056418
DATED             : August 13, 2013
INVENTOR(S)       : Tanase et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 370 days.

Signed and Sealed this

Fifteenth Day of September, 2015

Michelle K. Lee
*Director of the United States Patent and Trademark Office*